(12) United States Patent
Satoh (10) Patent No.: US 7,511,644 B2
(45) Date of Patent: Mar. 31, 2009

(54) VARIABLE RESISTANCE LOGIC

(75) Inventor: Yasuo Satoh, Ibaraki (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/780,963

(22) Filed: Jul. 20, 2007

(65) Prior Publication Data

US 2009/0021404 A1    Jan. 22, 2009

(51) Int. Cl.
*H03M 7/20* (2006.01)
(52) U.S. Cl. .................. 341/102; 341/899; 341/120
(58) Field of Classification Search ............. 341/155, 341/144, 120, 118, 154, 50, 102, 172, 153
See application file for complete search history.

(56) References Cited

U.S. PATENT DOCUMENTS

| | | | | |
|---|---|---|---|---|
| 5,852,360 | A | * | 12/1998 | Levinson ................ 323/316 |
| 6,476,736 | B2 | * | 11/2002 | Bartlett ................... 341/56 |
| 6,768,393 | B2 | * | 7/2004 | Song ..................... 333/22 R |
| 6,815,979 | B2 | * | 11/2004 | Ooshita .................. 326/30 |
| 6,933,917 | B2 | * | 8/2005 | Chung et al. ............ 345/98 |

* cited by examiner

*Primary Examiner*—Peguy JeanPierre
(74) *Attorney, Agent, or Firm*—Leffert Jay & Polglaze, P.A.

(57) ABSTRACT

A system comprising a control logic that generates a code having n digits, a translation logic coupled to the control logic that translates the code to a new code having greater than n digits, and a variable resistance logic coupled to the translation logic and comprising greater than n semiconductor devices. A resistance associated with the variable resistance logic depends on activation statuses of the semiconductor devices. The translation logic adjusts at least some of the semiconductor devices in accordance with the new code.

31 Claims, 6 Drawing Sheets

VARIABLE RESISTANCE LOGIC

BACKGROUND

Many types of resistors have adjustable resistance levels. Referred to as "variable resistors," these types of resistors may be adjusted to provide greater or less resistance to current that passes through the resistors. At least some such resistors provide a plurality of discrete resistance values from which to select a desired resistance value.

One characteristic commonly associated with such discrete variable resistors is that the multiple, discrete resistance values that the resistors provide are spaced unevenly. For example, at large resistance levels, intervals between pairs of consecutive resistance values may be undesirably large. At smaller resistance levels, intervals between pairs of consecutive resistance values may be undesirably small. Such uneven spacing between consecutive resistance values is undesirable.

BRIEF DESCRIPTION OF THE DRAWINGS

For a detailed description of illustrative embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. The term "connection" refers to any path via which a signal may pass. For example, the term "connection" includes, without limitation, wires, traces and other types of electrical conductors, optical devices, etc.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be illustrative of that embodiment, and not intended to intimate that the scope of the disclosure, including the claims, is limited to that embodiment.

Disclosed herein is a variable resistance apparatus which provides substantially even intervals between adjacent resistance levels throughout a range of possible resistance levels. The variable resistance apparatus may be implemented in any of a variety of systems, such as systems that require the ability to select from multiple resistance levels spaced at substantially even intervals. Although the scope of this disclosure is not limited to implementation of the apparatus in any specific type of system, the apparatus is described herein in the context of a resistor calibration system.

Figure 1:
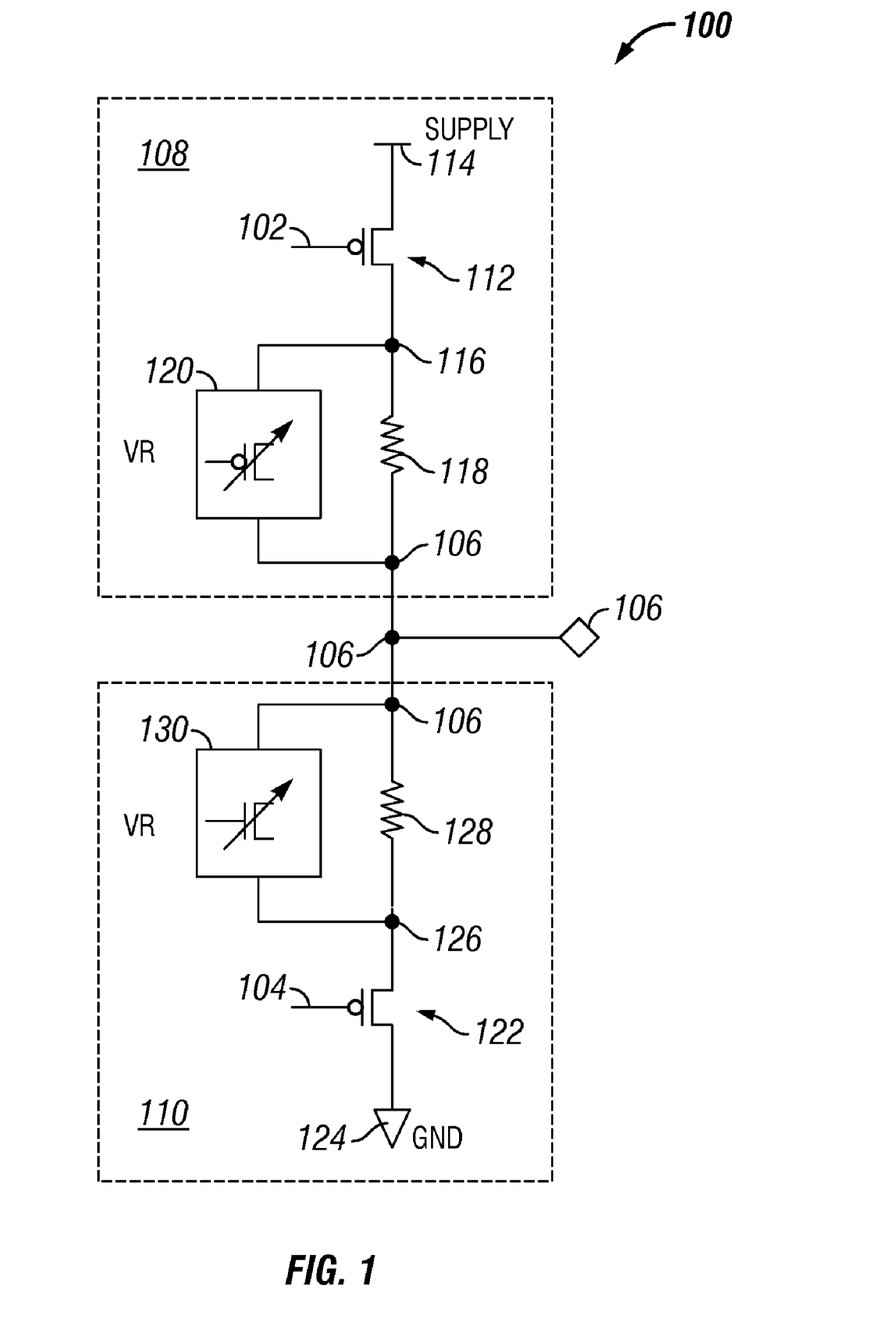
FIG. 1 shows an illustrative resistor in accordance with embodiments.

FIG. 1 shows an illustrative resistor 100 capable of implementing various embodiments of the variable resistance apparatus disclosed herein. The resistor 100 provides resistance to signals (e.g., currents) passing through the resistor 100. Signals are provided to the resistor 100 at input nodes 102 and 104. The same or different signals may be provided to nodes 102 and 104. In some embodiments, the node 102 may couple to the node 104, and thus nodes 102 and 104 receive the same signals. Signals are output by the resistor 100 at output node 106. The resistor 100 comprises a p-type metal oxide semiconductor field effect transistor (hereinafter "PMOS")-based component 108 and an n-type metal oxide semiconductor field effect transistor (hereinafter "NMOS")-based component 110, each of which is now described in turn. The component 108 comprises a transistor (e.g., a PMOS transistor) 112. The input node 102 couples to the gate of the transistor 112. The source of the transistor 112 couples to a supply voltage 114. The drain of the transistor 112 couples to a node 116. In turn, the node 116 couples to a parallel combination of a resistor (e.g., a poly-silicon resistor) 118 and a variable resistor (VR) 120. The parallel combination of the resistor 118 and the VR 120 couples to the output node 106. As described below, the VR 120, which comprises the variable resistance apparatus mentioned above, may be used to calibrate the resistance of the component 108 to a target resistance level. The component 110 is now described.

The component 110 comprises a transistor (e.g., an NMOS transistor) 122. A gate of the transistor 122 couples to the input node 104. The source of the transistor 122 couples to ground (GND) 124. The drain of the transistor 122 couples to a node 126. The node 126 couples to a parallel combination of a resistor (e.g., a poly-silicon resistor) 128 and a VR 130. The parallel combination of the resistor 128 and the VR 130 couples to the output node 106. As described below, the VR 130, which also comprises the variable resistance apparatus mentioned above, may be used to calibrate the resistance of the component 110 to a target resistance level.

In operation, a common signal is applied to both input nodes 102 and 104. Depending on the voltage associated with the signal, either the PMOS transistor 112 or the NMOS transistor 122 is activated (i.e., "turned on"). Current flows through the activated transistor and minimal, if any, current flows through the deactivated (i.e., "off") transistor. Both transistors 112 and 122 carry a resistance. The level of resistance provided by each of these transistors depends, at least in part, on the gate width-to-length ratio of that transistor. Resistance is applied to the current that flows through the activated transistor by that transistor. The resistance of a transistor may be set during manufacture of the transistor by designing the transistor to have a specific gate width-to-length ratio. Thus, resistance is provided to any current flowing through the activated transistor by that transistor.

After having passed through the activated transistor, further resistance is provided to the current by the parallel combination of a VR with another resistor (e.g., by the parallel combination of resistor 118 and VR 120 if the transistor 112 is activated, or by the parallel combination of resistor 128 and VR 130 if the transistor 122 is activated). The current, having passed through the parallel combination of a VR and a resistor, is output at node 106. In some embodiments, resistor 100 may be referred to as a "data input/output resistor" ("DQ" resistor). Such resistors may be implemented in various devices, such as memory devices (e.g., dynamic random access memory (DRAM)). As described below, because the VRs 120 and 130 implement embodiments of the disclosed variable resistance apparatus, the VRs 120 and 130 are capable of providing substantially even intervals between adjacent resistance levels throughout the range of possible resistance levels. For this reason, the VRs 120 and 130 are able to match or to closely approximate desired (i.e., target) resistance levels. By "substantially even," it may be meant that the intervals are spaced evenly, or at least more evenly than in many other systems.

Although the resistor 100 may be set to a desired resistance level, over time, various environmental factors (e.g., temperature, process, supply voltages) may cause the resistance of the resistor 100 to drift from the desired resistance level. For example, if the resistor 100 is calibrated to a target resistance of 240 Ohms, over time, environmental factors may cause the resistance of the resistor 100 to drift from 240 Ohms to, for example, 210 Ohms. For this reason, the resistor 100 can and should be calibrated. Accordingly, a calibration resistor, also known as an impedance input/output resistor ("ZQ" resistor), may be used to calibrate the DQ resistor 100.

Figure 2:
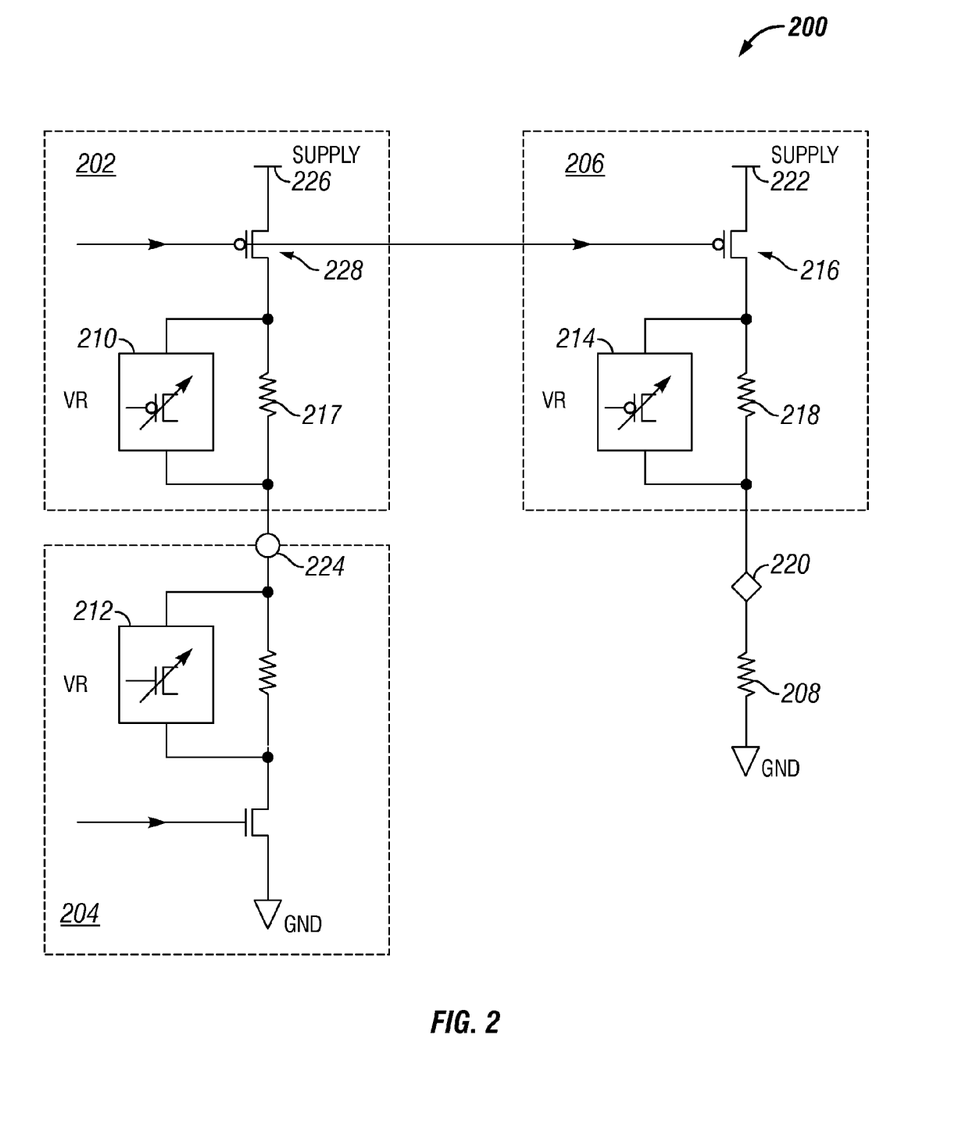
FIG. 2 shows an illustrative calibration resistor in accordance with embodiments.

FIG. 2 shows an illustrative ZQ resistor 200. The ZQ resistor 200 comprises a PMOS-based component 202, an NMOS-based component 204, and another PMOS-based component 206. In alternate embodiments, the components 202 and 206 may be NMOS-based components and the component 204 may be a PMOS-based component. Each of the components 202, 204 and 206 comprises a variable resistor (VR). Each of the VRs comprises a variable resistance apparatus, described above. The ZQ resistor 200 couples to a target resistor 208, the resistance level of which may be chosen as desired. In operation, the ZQ resistor 200 calibrates the components 202, 204 and 206 to the resistance level of the target resistor 208. For example, if it is desired that the components of the ZQ resistor 200 (and, subsequently, the DQ resistor 100) be calibrated to 240 Ohms, the target resistor 208 may comprise a resistance of 240 Ohms. Similarly, if the target calibration value for the components of the ZQ resistor 200 and the DQ resistor 100 is 300 Ohms, the target resistor 208 may comprise a resistance of 300 Ohms.

Calibration is performed by adjusting the VRs of each of the components until that component's overall resistance level (e.g., including the VR, transistor and poly-resistor) matches or closely approximates the resistance of the target resistor 208. In this way, the ZQ resistor 200 is calibrated. Once calibrated, the VR settings of some of the components 202, 204 and 206 may be applied to the VRs of the DQ resistor 100. For example, the settings of a PMOS component 202 may be applied to the PMOS component 108, thereby achieving similar resistance levels in both of these components. Similarly, the settings of an NMOS component 204 may be applied to the NMOS component 110, thereby achieving similar resistance levels in both of these components. In this way, the ZQ resistor 200 is used to calibrate the DQ resistor 100. The calibration of each of the ZQ resistor's components 202, 204 and 206 is now described, followed by a description of how a calibrated ZQ resistor 200 is used to calibrate the DQ resistor 100 (e.g., how settings of the ZQ resistor 200 are applied to the DQ resistor 100).

Figure 3:
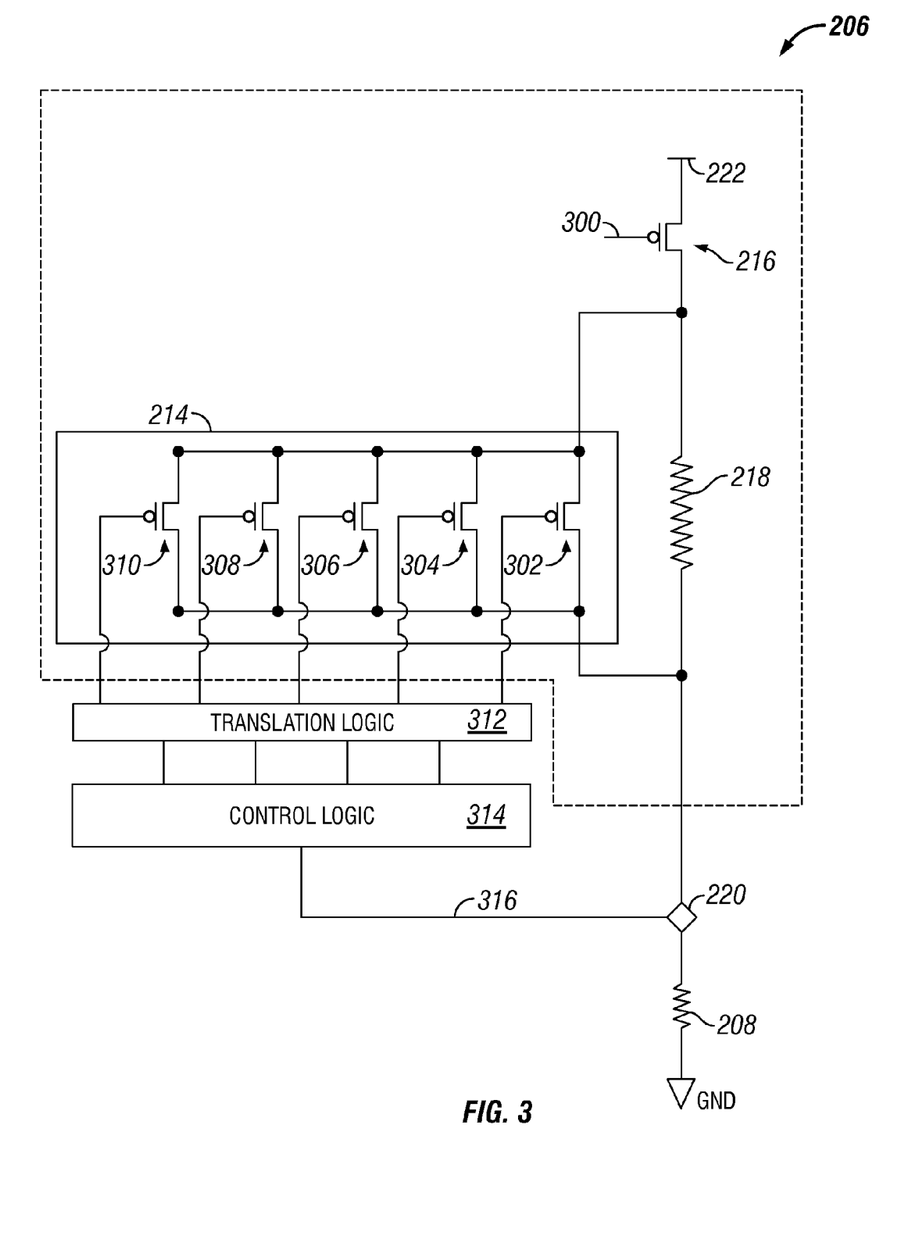
FIG. 3 shows a detailed view of a component associated with the resistors of FIGS. 1 and 2, in accordance with various embodiments.
Figure 4:
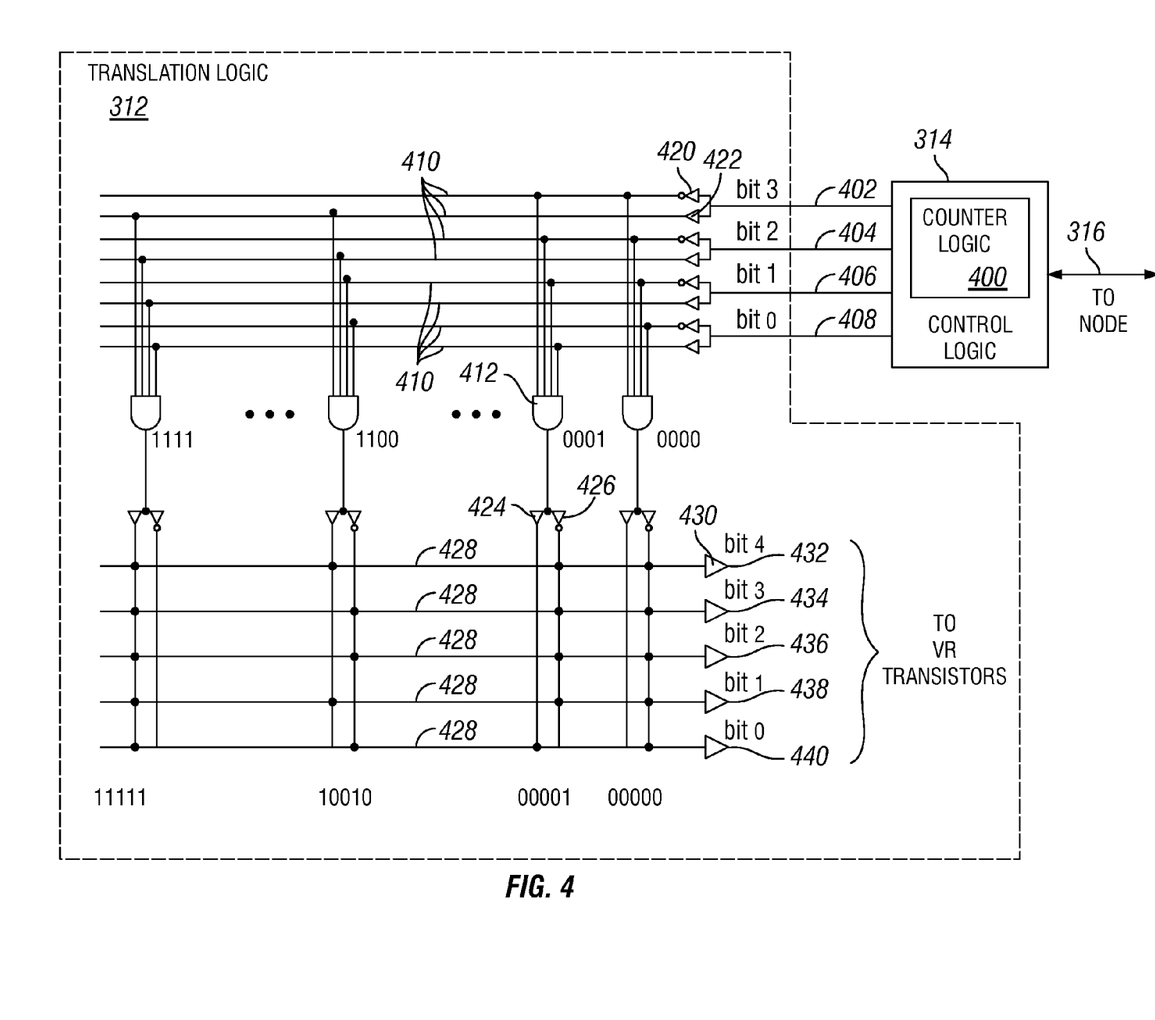
FIG. 4 shows a schematic of a translation logic and associated circuit logic used to calibrate the calibration resistor of FIG. 2, in accordance with various embodiments.

In at least some embodiments, the component 206 is the first component of the ZQ resistor 200 to be calibrated. Specifically, the VR 214 of the component 206 is repeatedly adjusted until a resistance level is reached which causes the overall resistance of the component 206 to be the same as the target resistance level (e.g., 240 Ohms) of the target resistor 208. The repeated adjustment of the VR 214 is performed by circuit logic (FIGS. 3 and 4a; described below) external to the ZQ resistor 200. To determine whether the resistances of the component 206 and the target resistor 208 match, the circuit logic monitors the voltage level at node 220. When the voltage at node 220 (i.e., the voltage across the target resistor 208) is half (or some predetermined fraction) of the supply voltage 222, the resistance levels of the component 206 and the target resistor 208 are substantially similar, if not the same. At this point, the circuit logic at least temporarily stops adjusting the VR 214. The component 206 has been calibrated to the resistance of the target resistor 208 (e.g., to 240 Ohms).

In at least some embodiments, the components 206 and 202 are of the same type. For example, the component 206 may be a PMOS-based component and the component 202 also may be a PMOS-based component. Accordingly, to calibrate the component 202, the settings of the VR 214 are applied to the VR 210. In this way, the component 202 is calibrated to the resistance level of the target resistor 208 (e.g., to 240 Ohms).

Unlike the components 202 and 206, however, the component 204 may be an NMOS-based component. Accordingly, separate circuit logic—albeit similar to the one used to calibrate the component 206—is used to calibrate the component 204. In particular, the circuit logic associated with the component 204 repeatedly adjusts the resistance level of the VR 212 until the overall resistance of the component 204 is substantially similar to that of the component 202. The resistance of the component 204 is matched to the resistance of the component 202 because the component 202 has already been calibrated (e.g., to 240 Ohms). The circuit logic of the component 204 repeatedly adjusts the resistance level of the VR 212 until the voltage at node 224 is half (or some predetermined fraction) of the supply voltage 226. When the voltage at node 224 is half of the supply voltage 226, the resistances of the components 202 and 204 are similar, if not the same. In this way, all of the components 202, 204 and 206 are calibrated to the desired resistance level (e.g., 240 Ohms) of the target resistor 208. When the components 202, 204 and 206 are calibrated to the desired resistance level, the ZQ resistor 200 is said to be calibrated.

Once the ZQ resistor 200 has been calibrated, it is used to calibrate the DQ resistor 100. Specifically, the component 108 of the DQ resistor 100 is a PMOS-based component. Accordingly, to calibrate the component 108, the settings of the PMOS-based VR 210 (or the settings of the PMOS-based VR 214) are applied to the VR 120. Similarly, the component 110 of the DQ resistor 100 is an NMOS-based component. Accordingly, to calibrate the component 110, the settings of the NMOS-based VR 212 are applied to the VR 130. Embodiments in which the VRs 120, 210 and 214 are NMOS-based still include the application of settings of the VR 210 and/or VR 214 to the VR 120. Similarly, embodiments in which the VRs 130 and 212 are PMOS-based still include the application of settings of the VR 212 to the VR 130. In this way, both the components 108 and 110 are calibrated to resistance levels (e.g., 240 Ohms) which match or closely approximate the target resistance level of the target resistor 208 of FIG. 2. The DQ resistor 100 is thus calibrated. Settings of the ZQ resistor's VRs may be applied to the DQ resistor's VRs using any suitable control logic, such as those used to adjust the VR settings of the ZQ resistor 200. Other control logic also may be used.

A detailed discussion of the adjustment of the VRs of some of the components (e.g., to match the resistance of the target resistor 208) is now provided. Referring to FIG. 2, as previously explained, the component 206 is calibrated to the target resistance level of the target resistor 208 by repeatedly adjusting the resistance level of the VR 214 until the voltage at node 220 is approximately half of the supply voltage 222 (i.e., until the resistances of the component 206 and the resistor 208 are substantially similar). FIG. 3 illustrates the means by which such repeated adjustments to the VR 214 are performed.

FIG. 3 shows a detailed view of the component 206 and, in particular, of the VR 214. As shown, the VR 214 comprises a plurality of transistors 302, 304, 306, 308 and 310 arranged in parallel. Although these transistors are shown as being PMOS transistors, NMOS-transistors also may be used (e.g., in component 204 of FIG. 2). Each of the transistors in the VR 214 may have a different transistor size, and thus a different resistance, associated therewith. For example, in some embodiments, the transistor 302 has a gate width-to-length ratio (WLR) of 8, the transistor 304 has a WLR of 4, the transistor 306 has a WLR of 2, the transistor 308 has a WLR of 1, and the transistor 310 has a WLR of 0.5. Because these transistors are arranged in parallel, transistors with larger WLRs are used for coarse tuning and transistors with smaller WLRs are used for fine tuning. Accordingly, continuing with the above example, the transistor 302 (with a WLR of 8) may have a resistance resolution of ⅛, the transistor 304 (with a WLR of 4) may have a resistance resolution of ¼, the transistor 306 (with a WLR of 2) may have a resistance resolution of ½, the transistor 308 (with a WLR of 1) may have a resistance resolution of 1, and the transistor 310 (with a WLR of 0.5) may have a resistance resolution of 2. However, because the transistors are arranged in parallel, adjustment of a transistor with a smaller resistance resolution results in a larger total resistance adjustment than does the adjustment of a transistor with a larger resistance resolution. Thus, for example, adjusting the transistor 302 may have a greater impact on the overall resistance of the VR 214 than would adjusting the transistor 310.

The transistors of the VR 214 are activated and deactivated by a translation logic 312 which, in turn, is controlled by a control logic 314. The control logic 314 couples to the node 220 via a connection 316. The control logic 314 monitors the voltage at node 220 as the control logic 314 and the translation logic 312 adjust the resistance of the VR 214 by activating and deactivating various transistors of the VR 214. When the control logic 314 determines (e.g., using a comparator (not shown) provided with the supply voltage 222 and the voltage at node 220) that the voltage at node 220 is half of the supply voltage 222, the control logic 314 and the translation logic 312 stop adjusting the resistance level of the VR 214. In this way, the component 206 is calibrated. A similar process may be performed to calibrate other components in the ZQ resistor 200, such as the component 204. FIG. 4 shows the translation logic 312 and the control logic 314 in detail.

Referring to FIG. 4, the control logic 314 comprises a counter logic 400 and monitors the voltage at the node 220 (FIG. 3) via connection 316. The counter logic 400 repeatedly produces binary codes. The binary codes comprise n (e.g., 4) digits (e.g., bits). The counter logic 400 increments each successive binary code by 1 bit until the maximum possible binary code value is reached, at which point the counter logic 400 resets and begins again. The binary code output by the counter logic 400 determines which of the transistors in the VR 214 are activated and which are deactivated.

As shown in FIG. 4, the binary code output by the control logic 314 (i.e., by the counter logic 400) comprises 4 bits. The 4 bits of the binary code are output on connections 402, 404, 406 and 408 to the translation logic 312. However, as shown in FIG. 3, the VR 214 comprises 5 transistors. Because the states of these 5 transistors are to be controlled by the values of only 4 bits, the translation logic 312 comprises various circuit logic which maps (i.e., translates) each possible permutation of the 4-bit binary code to a different, predetermined 5-bit binary code. This 5-bit binary code is output from the translation logic 312 on connections 432, 434, 436, 438 and 440 to the transistors of the VR 214. The translation logic 312 is hardwired (e.g., by a manufacturer or engineer) to translate each 4-bit (or n-bit) binary code received from the counter logic 400 to a specific, predetermined 5-bit (or n+1 bit or greater than n bit (>n)) binary code output to the transistors of the VR 214.

Figure 5:
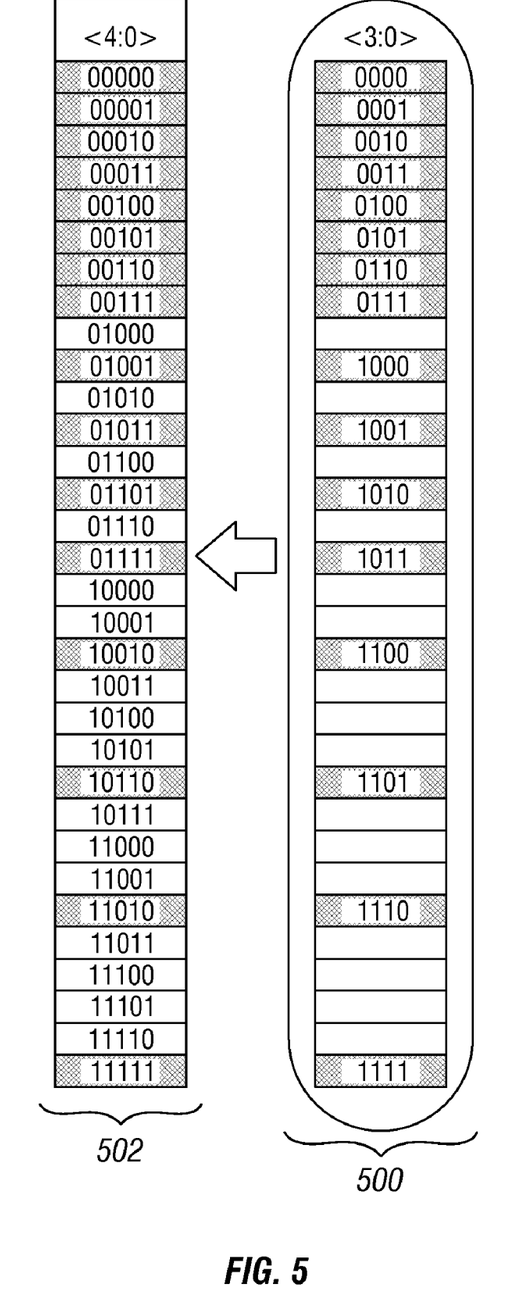
FIG. 5 shows an illustrative binary code mapping scheme implemented by the translation logic of FIG. 4, in accordance with various embodiments.

FIG. 5 shows two tables 500 and 502 that are illustrative of the mapping implemented by the translation logic 312. The table 502 comprises a plurality of 4-bit binary values, such as those output by the counter logic 400. Because the binary codes output by the counter logic 400 have 4 bits, there are a total of $2^4=16$ possible bit combinations represented in the table 500. Because the binary codes output by the translation logic 312 have 5 bits, there are a total of $2^5=32$ possible bit combinations represented in the table 502. The 4-bit binary code-to-5-bit binary code mapping that is implemented in the translation logic 312 may be designed as desired. However, in at least some embodiments, the 4-bit binary codes are mapped to 5-bit binary codes that result in resistance values of the component 206 that are evenly spaced.

For example, as shown in FIG. 5, the translation logic 312 maps the 4-bit binary code "1011" to the 5-bit binary code "01111." However, the translation logic does not map the next 4-bit binary code, "1100," to the next 5-bit binary code, "10000." Such a mapping would result in substantially uneven spacing between the various resistance values of the component 206. Instead, the translation logic 312 maps the 4-bit binary code "1100" to the predetermined 5-bit binary code "10010." This mapping facilitates more even spacing between the various possible resistance values of the component 206. Stated in another way, because there are 32 possible combinations for the 5-bit binary codes and only 16 possible combinations for the 4-bit binary codes, an entity designing or manufacturing the translation logic 312 may selectively map the 4-bit codes to the 5-bit codes so as to produce substantially even spacing between the resistance values produced by application of the 5-bit codes to the VR 214. The fact that there are a greater number of 5-bit binary code permutations possible than there are 4-bit binary code permutations possible may be leveraged to obtain the best spacing possible between resistance values. Thus, at least some of the $2^{n+1}$ binary code values are unused.

Referring again to FIG. 4, the translation logic 312 maps 4-bit (n bit) binary codes received on connections 402, 404, 406 and 408 to 5-bit (n+1 bit) binary codes output on connections 432, 434, 436, 438 and 440 as follows. A binary code output by the counter logic 400 is provided to the translation logic 312 on connections 402, 404, 406 and 408. For example, referring to both FIGS. 4 and 5, the 4-bit binary code "0001" may be output by the counter logic 400 to the translation logic 312. In this case, the most significant bit "0" would be present on connection 402, the second-most significant bit "0" would be present on connection 404, the third-most significant bit "0" would be present on connection 406, and the least significant bit "1" would be present on connection 408.

Each of the connections 402, 404, 406 and 408 couples to an inverter and a buffer. For example, the connection 402 couples to an inverter 420 and a buffer 422. In turn, each of the inverters and buffers couples to a different connection 410. Thus, for instance, the "0" bit present on connection 402 is converted to a "1" bit by inverter 420 and remains a "0" when passed through the buffer 422. The remaining bits "0," "0" and "1" on connections 404, 406 and 408 are processed by their respective inverters and buffers in a similar manner.

The translation logic 312 comprises a plurality of logic gates (e.g., AND gates) which couple to the connections 410. The translation logic 312 comprises a logic gate for each possible combination of the 4-bit binary code input to the translation logic 312, for a total of $2^4=16$ logic gates. Continuing with the above example, the logic gate corresponding to the binary code "0001" is used, while the remaining logic gates are not used. In this case, logic gate 412 is activated, since the buffers and inverters coupled to the input connections 402, 404, 406 and 408 provide signals on the connections 410 that cause the output of the gate 412 to be "true," or "1." The outputs of the remaining gates are "false," or "0."

The "1" output of the gate 412 is provided to buffer 424 and to inverter 426. The buffer 424 and inverter 426 couple to connections 428 in such a way that the 5-bit binary code corresponding to "0001," which is "00001" (FIG. 5), is output on the connections 432, 434, 436, 438 and 440 via buffers 430. In this case, with an output 5-bit binary code of "00001," the most significant bit "0" is present on the connection 432, a bit "0" is present on connection 434, a bit "0" is present on connection 436, a bit "0" is present on connection 438 and a bit "1" is present on connection 440. In this way, a 4-bit binary code "0001" provided to the translation logic 312 by the counter logic 400 is translated to a 5-bit binary code "00001." In turn, the 5-bit binary code "00001" is provided to the transistors of the VR 214. Referring to FIG. 3, the binary code "00001" deactivates transistors 302, 304, 306 and 308 and activates transistor 310. Each time the counter logic 400 increments the 4-bit binary code output by the logic 400, the translation logic 312 outputs a 5-bit binary code that corresponds to the 4-bit binary code, in accordance with the tables of FIG. 5. In this way, the resistance of the VR 214 is repeatedly adjusted until the control logic 314 detects, via connection 316, that the voltage at node 220 is some particular fraction (e.g., one-half) of the supply voltage 322. When the voltage at node 220 is approximately half of the supply voltage 322, the counter logic 400 may halt incrementing, and the calibration process for the component 206 is complete.

Referring again to FIGS. 4 and 5, the mapping of 4-bit binary codes to 5-bit binary codes shown in the tables of FIG. 5 may be adjusted by modifying the connections shown in the translation logic 312 of FIG. 4. For example, as shown in FIG. 4 and as explained above, a 4-bit binary input code of "0001" is mapped to a 5-bit binary code of "00001." To achieve this mapping, the inverter 426 coupled to gate 412 couples to connections 432, 434, 436 and 438, while the buffer 424 couples to connection 440. However, if an entity such a manufacturer or designer desires for the binary code "0001" to instead map to the binary code "01000," the inverter 426 may be made to couple to connections 432, 436, 438 and 440, while the buffer 424 couples to connection 434. Similar adjustments may be made to connections 402, 404, 406, 408 and 410 to alter the mapping scheme shown in the tables of FIG. 5, as desired.

As explained above, in some embodiments, mapping n-bit input binary codes to specific n+1 bit output binary codes enables the translation logic 312 to activate only those resistance values of the VR 214 which cause the overall resistances of the component 206 to be spaced substantially evenly. Such substantially even spacing is useful in the calibration of resistors (e.g., the ZQ and DQ resistors described above) because the even spacing enables the resistors to most closely approximate the target resistance value. For example, a calibration system lacking the variable resistance apparatus disclosed herein may be able to calibrate a resistor to 100 Ohms, 105 Ohms, 110 Ohms, 150 Ohms and 200 Ohms. Such a resistor could not be calibrated to a target resistance value of, for example, 174 Ohms. At best, this resistor could be calibrated to 150 Ohms, leaving a difference of 24 Ohms from the target resistance value. However, a calibration system implementing the variable resistance apparatus disclosed herein may be able to calibrate a resistor to 100 Ohms, 125 Ohms, 150 Ohms, 175 Ohms and 200 Ohms. This resistor could be calibrated to a target resistance value of 175 Ohms, leaving a difference of only 1 Ohm from the desired resistance value. Thus, by evenly spacing the intervals between possible resistance values, on average, more accurate calibrations may be achieved. As mentioned, the scope of this disclosure is not limited to implementation of the disclosed variable resistance apparatus in calibration systems. Various electronic devices may implement the disclosed variable resistance apparatus and/or calibration systems implementing the disclosed variable resistance apparatus. All such variations and implementations are included within the scope of this disclosure.

Figure 6:
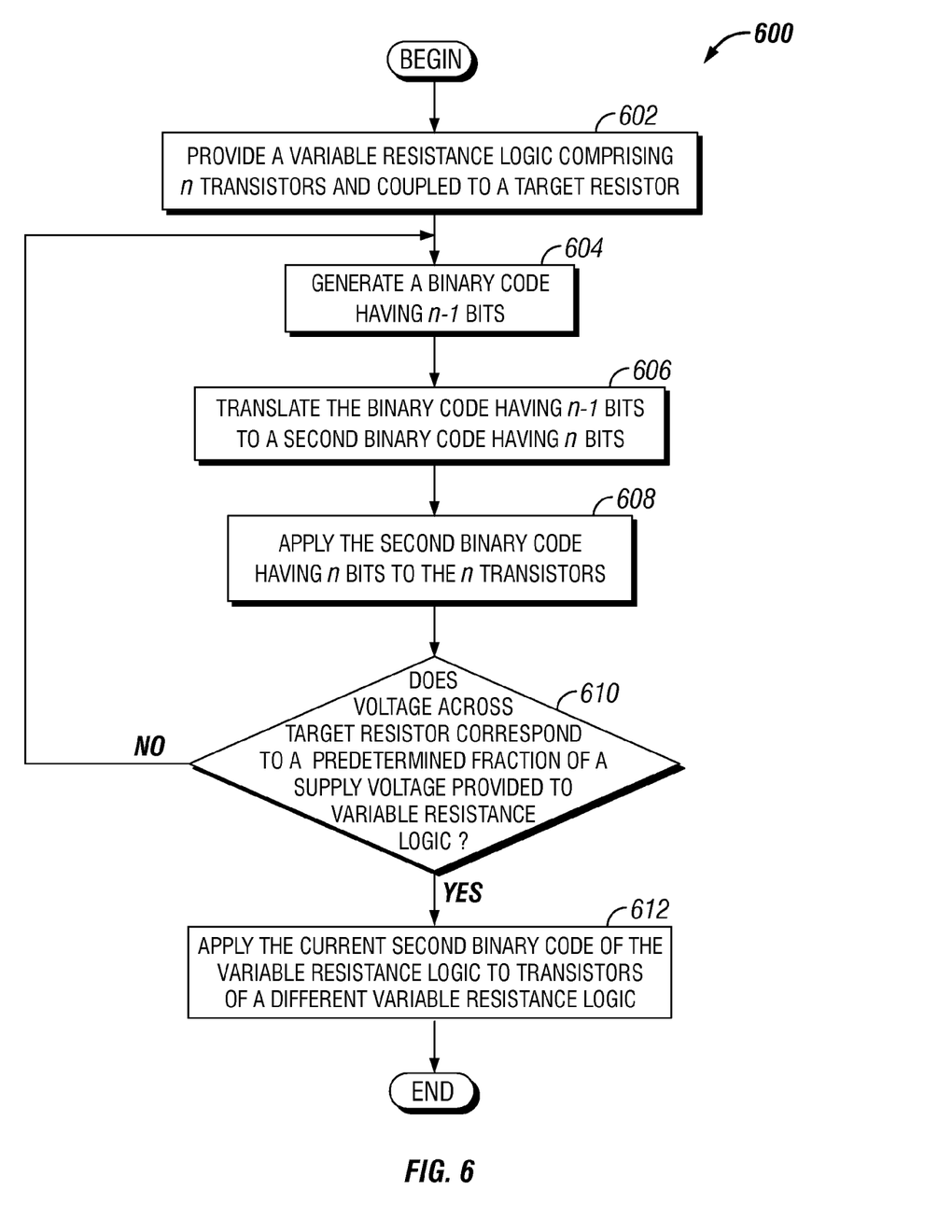
FIG. 6 shows a method implemented in accordance with various embodiments.

FIG. 6 shows an illustrative method 600 implemented in accordance with various embodiments. The method 600 begins by providing a variable resistance logic comprising n transistors and coupled to a target resistor (block 602). The method 600 comprises generating a binary code having n–1 bits (i.e., fewer than n bits) (block 604). The method 600 comprises translating the binary code having n–1 bits to a second binary code having n bits (block 606). The method 600 then comprises applying the second binary code having n bits to the n transistors of the variable resistance logic (block 608). The method 600 also comprises determining whether a voltage across the target resistor corresponds to a predetermined fraction (e.g., one-half) of a supply voltage provided to the variable resistance logic (block 610). If so, the method 600 comprises applying the current second binary code of the variable resistance logic to transistors of a different variable resistance logic (block 612). Otherwise, the method 600 comprises returning to block 604. The various portions of the method 600 may be performed in any suitable, desired order.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
control logic that generates a code having n digits;
translation logic coupled to the control logic and that translates the code to a new code having greater than n digits; and
variable resistance logic coupled to the translation logic and comprising greater than n semiconductor devices, a resistance associated with the variable resistance logic depending on activation statuses of the semiconductor devices;
wherein the translation logic adjusts at least some of said semiconductor devices in accordance with said new code.

2. The system of claim 1, wherein the system comprises a memory device.

3. The system of claim 1, wherein the control logic at least temporarily stops generating codes if the control logic determines that said resistance associated with the resistance logic corresponds to a target resistance level.

4. The system of claim 3, wherein the control logic determines whether said resistance associated with the resistance logic corresponds to the target resistance level by determining whether a voltage across a target resistor having the target resistance level corresponds to half of a supply voltage provided to the system.

5. The system of claim 1, wherein the translation logic comprises a plurality of gates, each gate corresponding to a different one of $2^n$ binary codes having n digits, each gate also corresponding to a different binary code having greater than n digits.

6. A system, comprising:
 control logic adapted to generate a first code having n digits;
 translation logic that maps each of $2^n$ binary codes to a different one of $2^{>n}$ binary codes; and
 variable resistance logic comprising >n transistors arranged in parallel;
 wherein the translation logic receives said first binary code, translates said first binary code to a corresponding binary code having >n digits, and provides the corresponding binary code to the variable resistance logic;
 wherein the variable resistance logic adjusts said >n transistors in accordance with said corresponding binary code.

7. The system of claim 6, wherein the system comprises dynamic random access memory (DRAM).

8. The system of claim 6, wherein the system comprises a poly-silicon resistor coupled in parallel with said variable resistance logic to form a combination, and wherein the system comprises another transistor coupled in series with said combination, and wherein the control logic repeatedly generates binary codes having n digits until a voltage across a target resistor coupled to said combination is a particular fraction of a supply voltage provided to the system.

9. The system of claim 8, wherein said predetermined fraction comprises one-half.

10. The system of claim 8, wherein, when the voltage across the target resistor comprises said particular fraction, a resistance associated with the combination and said another transistor corresponds to a target resistance of the target resistor.

11. The system of claim 6, wherein the system comprises a target resistor coupled to a calibration resistor comprising the variable resistance logic, and wherein the control logic adjusts the variable resistance logic until the calibration resistor has a calibration resistance associated with a target resistance of the target resistor.

12. The system of claim 11, wherein transistor settings of the variable resistance logic are applied to a second resistor.

13. The system of claim 12, wherein PMOS-transistor settings of the variable resistance logic are applied to PMOS-transistors of the second resistor, and wherein NMOS-transistor settings of the variable resistance logic are applied to NMOS-transistors of the second resistor.

14. A system, comprising:
 a first resistor comprising a first variable resistor; and
 a second resistor comprising a semiconductor-based variable resistor, the second resistor coupled to a non-variable resistor having a target resistance; and
 control logic adapted to calibrate said semiconductor-based variable resistor in accordance with said target resistance using a translation logic which maps each of $2^n$ binary codes to one of $2^{>n}$ binary codes, said $2^n$ binary codes generated by the control logic and said $2^{>n}$ binary codes associated with >n transistors arranged in parallel in said semiconductor-based variable resistor;
 wherein the first variable resistor is calibrated in accordance with said semiconductor-based variable resistor.

15. The system of claim 14, wherein the system comprises a memory device.

16. The system of claim 14, wherein the first variable resistor and the semiconductor-based variable resistor either are both PMOS-based resistors or are both NMOS-based resistors.

17. The system of claim 14, wherein the first resistor comprises a DQ resistor and the second resistor comprises a ZQ resistor.

18. The system of claim 14, wherein the $2^n$ binary codes are generated by a counter logic stored in the control logic.

19. The system of claim 14, wherein the control logic calibrates said semiconductor-based variable resistor in accordance with said target resistance by providing the translation logic with at least some of said $2^n$ binary codes until a voltage across the non-variable resistor corresponds to another voltage across the second resistor.

20. The system of claim 14, wherein the control logic calibrates said semiconductor-based variable resistor in accordance with said target resistance by providing the translation logic with at least some of said $2^n$ binary codes until a voltage across the non-variable resistor corresponds to approximately half of a supply voltage provided to the second resistor.

21. A system, comprising:
 a first resistor comprising a first NMOS-based variable resistor having n transistors arranged in parallel and a first PMOS-based variable resistor having n transistors arranged in parallel;
 a second resistor comprising a second PMOS-based resistor having n transistors arranged in parallel and a second NMOS-based resistor having n transistors arranged in parallel;
 a target resistor coupled to the second PMOS-based resistor and having a target calibration resistance;
 a counter adapted to generate a plurality of codes having n−1 digits; and
 translation logic that maps each one of said codes having n−1 digits to a different code having n digits and applies at least one of said different codes to the n transistors of the second PMOS-based resistor;
 wherein the translation logic applies a plurality of said different codes to the n transistors of the second PMOS-based resistor until a voltage across the target resistor is a particular fraction of a supply voltage provided to the second resistor;
 wherein a resistance of the second NMOS-based resistor is calibrated to a resistance of the second PMOS-based resistor;
 wherein settings associated with the n transistors of the second PMOS-based resistor are applied to the n transistors of the first PMOS-based resistor and settings associated with the n transistors of the second NMOS-based resistor are applied to the n transistors of the first NMOS-based resistor.

22. The system of claim 21, wherein the first resistor comprises a DQ resistor and the second resistor comprises a ZQ resistor.

23. The system of claim 21, wherein the system comprises a dynamic random access memory (DRAM).

24. A method, comprising:
generating a plurality of first codes having n−1 digits;
translating said plurality of first codes having n−1 digits to second codes having n digits;
applying said second codes having n digits to variable resistance logic comprising n transistors, the n transistors being arranged in parallel; and
if a voltage across a target resistor corresponds to a particular fraction of a supply voltage provided to the variable resistance logic coupled to the target resistor, applying a current second code associated with the n transistors of the variable resistance logic to transistors associated with a different variable resistance logic.

25. The method of claim 24, wherein the variable resistance logic is associated with a ZQ resistor and the different variable resistance logic is associated with a DQ resistor.

26. A resistor, comprising:
a first resistor;
a variable resistor coupled in parallel with the first resistor; and
circuit logic coupled to the variable resistor and adapted to control the variable resistor;
wherein the variable resistor and the circuit logic are adapted to collectively and selectively provide a plurality of resistances for the resistor;
wherein the variable resistor is adapted to permit $2^n$ discrete resistance values; and
wherein the control logic is adapted to control the variable resistor to provide less than the $2^n$ discrete resistance values.

27. The resistor of claim 26, wherein the variable resistor comprises a plurality of transistors, each of the transistors having a different on-resistance.

28. The resistor of claim 27, wherein each of the transistors has a different gate width-to-length ratio.

29. The resistor of claim 27, wherein the circuit logic activates only those of transistors which cause the resistor to have a particular one of the plurality of resistances.

30. The resistor of claim 26, wherein a spacing of resistance values between the less than $2^n$ discrete resistance values is more even than a spacing of resistance values between the $2^n$ discrete resistance values.

31. The resistor of claim 26, wherein the less than $2^n$ discrete resistance values comprises $2^{n-1}$ discrete resistance values.

* * * * *